(12) United States Patent
Fang et al.

(10) Patent No.: US 11,196,248 B2
(45) Date of Patent: Dec. 7, 2021

(54) BIDIRECTIONAL FLAT CLAMP DEVICE WITH SHARED VOLTAGE SENSOR CIRCUIT

(71) Applicant: TEXAS INSTRUMENTS INCORPORATED, Dallas, TX (US)

(72) Inventors: Zhao Fang, Plano, TX (US); Mark Benjamin Welty, McKinney, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 190 days.

(21) Appl. No.: 16/178,796

(22) Filed: Nov. 2, 2018

(65) Prior Publication Data

US 2020/0144813 A1    May 7, 2020

(51) Int. Cl.
*H02H 9/04* (2006.01)
*G01R 19/165* (2006.01)
*H02H 9/00* (2006.01)

(52) U.S. Cl.
CPC ......... *H02H 9/04* (2013.01); *G01R 19/16519* (2013.01); *G01R 19/16523* (2013.01); *H02H 9/005* (2013.01)

(58) Field of Classification Search
CPC ............. H01L 27/0255; H01L 27/0266; H01L 27/0285; H01L 29/866; H01L 29/1095; H01L 29/0847; H01L 29/41758; H01L 29/7835; H02H 9/041; H02H 9/046

USPC .......................................................... 361/56
See application file for complete search history.

(56) References Cited

U.S. PATENT DOCUMENTS

| | | | | |
|---|---|---|---|---|
| 4,491,750 A * | 1/1985 | Janutka | ............... | H03K 17/6874 327/436 |
| 5,875,245 A * | 2/1999 | Miyasita | ............... | H04M 19/04 379/382 |
| 2006/0082395 A1* | 4/2006 | Fukushi | ........... | G01R 19/16552 327/77 |
| 2013/0320396 A1* | 12/2013 | Salman | ............... | H01L 27/0262 257/119 |
| 2015/0303678 A1* | 10/2015 | Wang | ....................... | H02H 9/04 361/86 |

* cited by examiner

*Primary Examiner* — Kevin J Comber
(74) *Attorney, Agent, or Firm* — Michelle F. Murray; Charles A. Brill; Frank D. Cimino

(57) ABSTRACT

A bidirectional flat clamp device includes a first device node and a second device node. The bidirectional flat clamp device also includes a first switch and a second switch coupled in series between the first and second device nodes. The bidirectional flat clamp device also includes at least one switch driver coupled to the first and second switches. The bidirectional flat clamp device also includes a first current path between the first and second device nodes, the first current path having a first diode, a voltage sensor circuit, and a second diode. The bidirectional flat clamp device also includes a second current path between the first and second device nodes, the second current path having a third diode, the voltage sensor circuit, and a fourth diode.

20 Claims, 8 Drawing Sheets

BIDIRECTIONAL FLAT CLAMP DEVICE WITH SHARED VOLTAGE SENSOR CIRCUIT

BACKGROUND

A surge clamp is a device that provides surge protection to one or more electronic components that are sensitive to voltage surge. As an example, a surge clamp is used to protect a power supply system so that downstream devices can operate at a relatively safe voltage level even when the system is under a surge event. Conventional transient voltage suppression (TVS) clamps are widely used as surge clamps across a wide range of applications. However conventional TVS clamps include only diodes or diode-like devices, in which there is no active circuit to form any feedback loop. As such, the dynamic resistance (e.g., $R_{dyn}=\Delta V/\Delta I$) of a TVS clamp tends to be fairly high during a surge event. The high dynamic resistance $R_{dyn}$ reduces the precision in clamping voltage with respect to a large amount of surge current. Another issue with surge clamps involves their unidirectional design. With a unidirectional design, if the surge clamp is not properly coupled to other components, damage and/or non-functionality results.

SUMMARY

In accordance with an example of the disclosure, a bidirectional flat clamp device comprises a first device node and a second device node. The bidirectional flat clamp device also comprises a first switch and a second switch coupled in series between the first and second device nodes. The bidirectional flat clamp device also comprises at least one switch driver coupled to the first and second switches. The bidirectional flat clamp device also comprises a first current path between the first and second device nodes, the first current path having a first diode, a voltage sensor circuit, and a second diode. The bidirectional flat clamp device also comprises a second current path between the first and second device nodes, the second current path having a third diode, the voltage sensor circuit, and a fourth diode.

In accordance with an example of the disclosure, a system comprises a first node, a second node, and a bidirectional flat clamp device coupled between the first node and the second node. The system also comprises a circuit coupled in parallel with the bidirectional flat clamp device between the first node and the second node. The bidirectional flat clamp device comprises a first current path configured to direct current flow between the first node and the second node in a first direction. The bidirectional flat clamp device also comprises a second current path configured to direct current flow between the first node and the second node in a second direction. The bidirectional flat clamp also comprises a voltage sensor circuit shared by the first current path and the second current path. The bidirectional flat clamp also comprises at least one switch driver coupled to voltage sensor circuit. The bidirectional flat clamp also comprises a first switch and a second switch coupled in series between the first node and the second node, wherein the at least one switch driver couples to a control terminal of the first switch and a control terminal of the second switch.

In accordance with an example of the disclosure, a bidirectional flat clamp method comprises detecting a voltage surge between a first node and a second node using a voltage sensor circuit shared by first and second current paths between the first and second nodes. The method also comprises in response to the detected voltage surge, asserting a voltage sense signal by the voltage sensor circuit. The method also comprises triggering drive operations of at least one power field effect transistor (FET) driver based on the voltage sense signal. The method also comprises using the drive operations to operate a pair of power FETs in series between the first and second nodes to provide a target voltage level between the first and second nodes.

BRIEF DESCRIPTION OF THE DRAWINGS

For a detailed description of various examples, reference will now be made to the accompanying drawings in which.

DETAILED DESCRIPTION

Figure 1:
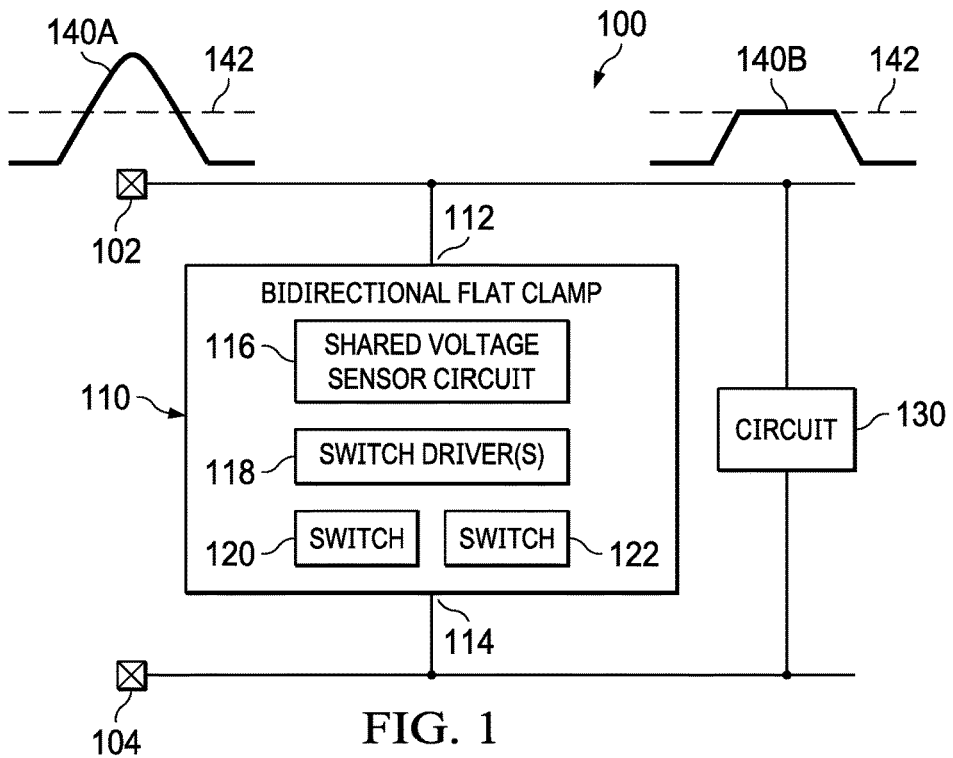
FIG. 1 is a block diagram showing a system in accordance with various examples.

Disclosed herein are bidirectional flat clamp topologies and related devices, systems, and methods, where the disclosed bidirectional flat clamp topologies include a shared voltage sensor circuit. As used herein, a "shared voltage sensor circuit" in the context of a bidirectional flat clamp refers to a voltage sensor circuit that is shared by different current paths between first and second nodes of the bidirectional flat clamp. With the shared voltage sensor circuit, the footprint of the disclosed bidirectional flat clamp topologies is reduced compared to other bidirectional flat clamp topology options. As another option, the disclosed bidirectional flat clamp topologies include a single switch driver, which further reduces the footprint of the disclosed bidirectional flat clamp topologies compared to other bidirectional flat clamp topology options.

An example bidirectional flat clamp includes a first node and a second node. The bidirectional flat clamp also includes a first switch and a second switch coupled in series between the first and second nodes. To control the first and second switches, the bidirectional flat clamp also includes at least one switch driver to control the first and second switches. In some examples, the first and second switches are power field effect transistors (FETs) and the switch driver is a power FET driver. The bidirectional flat clamp also includes a shared voltage sensor circuit between the first and second nodes. The shared voltage sensor circuit is configured to provide a voltage sense signal that indicates when a voltage difference between the first and second nodes is greater than a threshold. The at least one switch driver directs switching operations of the first and second switches based on the voltage sense signal provided by the shared voltage sensor circuit.

In some examples, a disclosed bidirectional flat clamp employs diodes to provide first and second current flow paths. The first current flow path extends in one direction from the first node to the shared voltage sensor circuit to the second node, where a first diode is placed along the first current flow path between the first node and the shared voltage sensor circuit. Also, a second diode is placed along the first current flow path between the shared voltage sensor circuit and the second node. Similarly, the second current flow path extends in one direction from the second node to the shared voltage sensor circuit to the first node, where a third diode is placed along the second current flow path between the second node and the shared voltage sensor circuit. Also, a fourth diode is placed along the second current flow path between the shared voltage sensor circuit and the first node.

In some examples, a disclosed bidirectional flat clamp employs a single switch driver, diodes are used to control a direction of current flow between the first and second nodes and the single switch driver. In this manner, either the first node or the second node powers the single switch driver while preventing uncontrolled current flow between the first and second nodes.

In some examples, a disclosed bidirectional flat clamp may be implemented monolithically (e.g., an integrated circuit or chip). In another example, a disclosed bidirectional flat clamp is part of an apparatus or system, where the first node of the bidirectional flat clamp couples to a power/signal line and the second node of the bidirectional flat clamp couples to a ground line, or vice versa. In an apparatus or system scenario, another circuit is coupled between the power/signal line and the ground line in parallel with the bidirectional flat clamp, where the bidirectional flat clamp protects the circuit from voltage surge or overvoltage conditions. As an example, if the voltage on the power/signal line exceeds a threshold, the switches of the bidirectional flat clamp are controlled to allow current to flow between the power/signal line and the ground line, which reduces the voltage across the circuit to a predetermined level that prevents damage to the circuit. With the example bidirectional flat clamp, an apparatus or system designer is able to couple the first node of the bidirectional flat clamp to either the power/signal line or the ground line while the second node of the bidirectional flat clamp is coupled to the other line without risk of failure or damage that would result from improperly coupling a unidirectional flat clamp to a power/signal line and ground line. Also, the shared voltage sensor circuit and/or single switch driver of the bidirectional flat clamp reduces its footprint relative to other bidirectional flat clamp options.

In some examples, disclosed bidirectional flat clamps have a breakdown voltage between 5-35 Volts. Also, in different examples, NMOS or PMOS transistors are used for the shared voltage sensor circuit of a bidirectional flat clamp. Also, in different examples, an NMOS or PMOS transistor is used for each switch driver of a bidirectional flat clamp. For bidirectional flat clamps with power FETs, each power FET is controlled by a shared power FET driver or respective power FET drivers. An example power FET includes a control terminal, a first current terminal, a second current terminal, and a diode across the first and second current terminals. To provide a better understanding, various bidirectional flat clamp options, including shared voltage sensor circuit options and/or other options are described using the figures as follows.

FIG. 1 is a block diagram showing a system 100 in accordance with various examples. In different examples, the system 100 is an integrated circuit, a multi-die module, a printed circuit board (PCB), and/or other electronic device with two nodes 102 and 104. Between the nodes 102 and 104, the system 100 includes a bidirectional flat clamp 110 and a circuit 130 in parallel, where the bidirectional flat clamp 110 provides overvoltage protection to the circuit 130. In some examples, the circuit 130 is a power converter circuit (e.g., a DC-DC converter). In other examples, the circuit 130 is another circuit where overvoltage protection is desirable.

Regardless of the particular type of circuit 130, the bidirectional flat clamp 110 operates to selectively decrease a voltage level across the nodes 102 and 104. For example, if a voltage signal 140A at node 102 is above a threshold 142, the bidirectional flat clamp 110 allows current flow between the first node 102 and the second node 104 such that the voltage signal 140A becomes a clamped voltage signal 140B (e.g., clamped to the threshold 142 as shown, or clamped to a value relative to the threshold 142) for use by the circuit 130. For the above example, the node 104 is assumed to couple to ground while the node 102 couples to a power/signal line. In other examples, the node 104 couples to a power/signal line that provides the voltage signal 140A and the node 102 couples to ground. In either case, the bidirectional flat clamp 110 is able to provide the clamped voltage signal 140B. In different examples, the circuit 130 may be unidirectional or bidirectional.

To provide a clamped voltage signal such as the clamped voltage signal 140B, the bidirectional flat clamp 110 comprises a first device node 112 and a second device node 114. In the example of FIG. 1, the first device node 112 couples to the node 102 and the second device node 114 couples to the node 104. In other examples, the first device node 112 couples to the node 104, and the second device node 114 couples to the node 102. In either case, the bidirectional flat clamp 110 provides overvoltage protection. In some examples, the bidirectional flat clamp 110 provides overvoltage protection using a shared voltage sensor circuit 116, switch driver(s) 118, and two switches 120 and 122. In operation, the shared voltage sensor circuit 116 detects when a voltage across the nodes 102 and 104 exceeds a threshold such as the threshold 142. In response, the switch driver(s) 118 direct operations of the switches 120 and 122 to allow current flow between the nodes 102 and 104, which reduces the voltage across the nodes 102 and 104 and results in the clamped voltage signal 140B. In some examples, the switches 120 and 122 are power FETs and each of the switch driver(s) 118 is a power FET driver. With the shared voltage sensor circuit 116, the circuitry footprint for the bidirectional flat clamp 110 is reduced compared to bidirectional flat clamp topologies that use multiple voltage sensor circuits.

Figure 2:
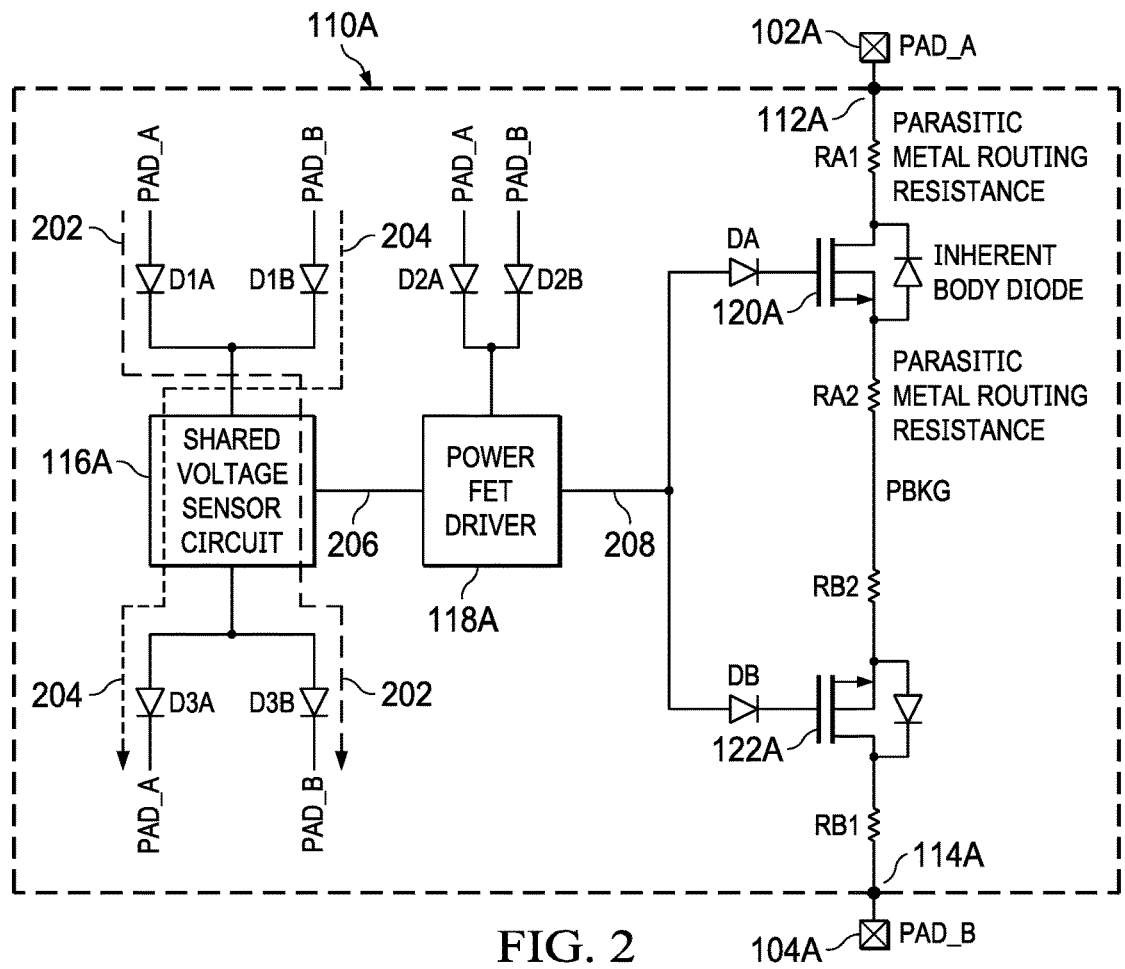
FIG. 2 is a schematic diagram showing a bidirectional flat clamp device in accordance with various examples.

FIG. 2 is a schematic diagram showing a bidirectional flat clamp device 110A in accordance with various examples. In FIG. 2, the bidirectional flat clamp device 110A is an example of the bidirectional flat clamp 110 of FIG. 1. In some examples, the bidirectional flat clamp device 110A corresponds to an integrated circuit or chip. As shown, the bidirectional flat clamp device 110A includes a shared voltage sensor circuit 116A, which is an example of the shared voltage sensor circuit 116 of FIG. 1. Also, the bidirectional flat clamp device 110A includes first and second device nodes 112A and 114A, which are examples of the first and second device nodes 112 and 114 in FIG. 1. The device node 112A couples to "PAD_A", which represents node 102 of FIG. 1 or another connection point. Meanwhile, the device node 114A couples to "PAD_B", which represents node 104 of FIG. 1 or another connection point. In FIG. 2, the bidirectional flat clamp device 110A is represented as having the first device node 112A coupled to PAD_A and the second device node 114A coupled to PAD_B. As another option, the first device node 112A could be coupled to PAD_B while the second device node 114A is coupled to PAD_A.

To control the direction of current flow through the shared voltage sensor circuit 116A and to prevent current flow directly between PAD_A and PAD_B, the bidirectional flat clamp device 110A includes diodes D1A, D1B, D3A and D3B. More specifically, D1A is positioned along a first current path 202 that extends from PAD_A (or the first device node 112A) to the shared voltage sensor circuit 116A, where D1A's cathode faces the shared voltage sensor circuit 116A. Also, D1B is positioned along a second current path 204 that extends from PAD_B (or the second device node 114A) to the shared voltage sensor circuit 116A, where D1B's cathode faces the shared voltage sensor circuit 116A. Meanwhile, D3B is positioned along the first current path 202 between PAD_B (or the second device node 114A) and the shared voltage sensor circuit 116A, where D3B's cathode faces PAD_B. Also, D3A is positioned along the second current path 204 between PAD_A (or the first device node 112A) and the shared voltage sensor circuit 116A, where D3A's cathode faces PAD_A.

In FIG. 2, the bidirectional flat clamp device 110A also includes a single power FET driver 118A, which is an example of the switch driver(s) 118 in FIG. 1. To control the direction of current flow to the single power FET driver 118A and to prevent current flow directly between PAD_A and PAD_B (or between the first and second device nodes 112A and 114A), the bidirectional flat clamp device 110A includes diodes D2A and D2B. More specifically, D2A is between PAD_A (or the first device node 112A) and the single power FET driver 118A, where D2A's cathode faces the single power FET driver 118A. Meanwhile, D2B is between PAD_B (or the second device node 114A) and the single power FET driver 118A, where D2B's cathode faces the single power FET driver 118A.

In response to a voltage level between PAD_A and PAD_B being above a threshold, the shared voltage sensor circuit 116A provides a control signal 206 to the single power FET driver 118A, where the control signal 206 indicates an overvoltage condition. In response to receiving the control signal 206, the single power FET driver 118A outputs a drive signal 208 to power FETs 120A and 122A, which are examples of the switches 120 and 122 in FIG. 1. In the example of FIG. 2, the drive signal 208 passes through a diode, DA, having its cathode facing a control terminal of the power FET 120A. The drive signal 208 also passes through a diode, DB, having its cathode facing a control terminal of the power FET 122A. In response to the drive signal 208, the power FETs 120A and 122A allow current flow between PAD_A and PAD_B or vice versa, resulting in a clamped voltage signal (e.g., the clamped voltage signal 140B) between PAD_A and PAD_B. As shown in FIG. 2, the current flow path through the power FETs 120A and 122A includes resistors (RA1, RA2, RB1, and RB2) corresponding to parasitic metal routing resistances.

Figure 3:
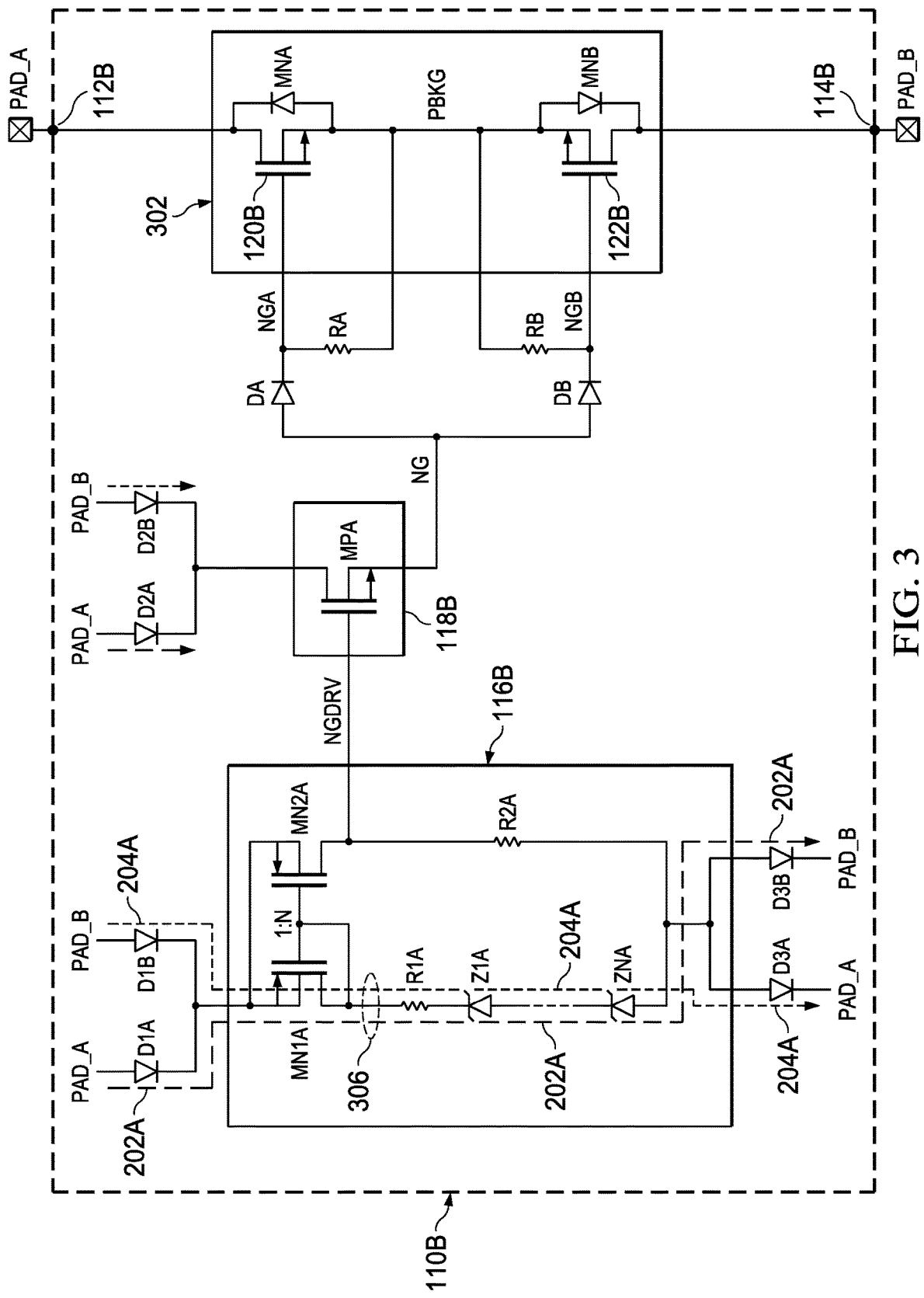
FIG. 3 is a schematic diagram showing another bidirectional flat clamp device in accordance with various examples.

FIG. 3 is a schematic diagram showing another bidirectional flat clamp device 110B in accordance with various examples. In FIG. 3, the bidirectional flat clamp device 110B is an example of the bidirectional flat clamp 110A of FIG. 2, or the bidirectional flat clamp 110 of FIG. 1. In some examples, the bidirectional flat clamp device 110B corresponds to an integrated circuit or chip. As shown, the bidirectional flat clamp device 110B includes a shared voltage sensor circuit 116B, which is an example of the shared voltage sensor circuit 116A of FIG. 2, or the shared voltage sensor circuit 116 of FIG. 1. Also, the bidirectional flat clamp device 110B includes first and second device nodes 112B and 114B, which are examples of the first and second device nodes 112A and 114A in FIG. 2, or the first and second device nodes 112 and 114 in FIG. 1. In FIG. 3, the device node 112B couples to PAD_A, which represents node 102 of FIG. 1 or another connection point. Meanwhile, the device node 114B couples to "PAD_B", which represents node 104 of FIG. 1 or another connection point. In FIG. 3, the bidirectional flat clamp device 110B is represented as having the first device node 112B coupled to PAD_A and the second device node 114B coupled to PAD_B. As another option, the first device node 112B could be coupled to PAD_B while the second device node 114B is coupled to PAD_A.

To control the direction of current flow through the shared voltage sensor circuit 116B and to prevent current flow directly between PAD_A and PAD_B, the bidirectional flat clamp device 110B includes diodes D1A, D1B, D3A and D3B. More specifically, D1A is positioned along a first current path 202A that extends from PAD_A (or the first device node 112B) to the shared voltage sensor circuit 116B, where D1A's cathode faces the shared voltage sensor circuit 116B. Also, D1B is positioned along a second current path 204A that extends from PAD_B (or the second device node 114B) to the shared voltage sensor circuit 116B, where D1B's cathode faces the shared voltage sensor circuit 116B. Meanwhile, D3B is positioned along the first current path 202A between PAD_B (or the second device node 114B) and the shared voltage sensor circuit 116B, where D3B's cathode faces PAD_B. Also, D3A is positioned along the second current path 204A between PAD_A (or the first device node 112B) and the shared voltage sensor circuit 116B, where D3A's cathode faces PAD_A.

In FIG. 3, the bidirectional flat clamp device 110B also includes a single power FET driver 118B, which is an example of the single power FET driver 118A in FIG. 2, or the switch driver(s) 118 in FIG. 1. To control the direction of current flow to the single power FET driver 118B and to prevent current flow directly between PAD_A and PAD_B (or between the first and second device nodes 112B and 114B), the bidirectional flat clamp device 110B includes diodes D2A and D2B. More specifically, D2A is between PAD_A (or the first device node 112B) and the single power FET driver 118B, where D2A's cathode faces the single power FET driver 118B. Meanwhile, D2B is between PAD_B (or the second device node 114B) and the single power FET driver 118B, where D2B's cathode faces the single power FET driver 118B.

In FIG. 3, the first and second current paths 202A and 204A include a shared path 306 through the shared voltage sensor circuit 116B. More specifically, the shared path 306 comprises a plurality of components in series. In some examples, the plurality of components in series along the shared path 306 include Zener diodes Z1A-ZNA (where the number of Zener diodes used depends on a target breakdown voltage for the bidirectional flat clamp device 110B), a resistor (R1A), and a PMOS transistor labeled "MN1A". In the example of FIG. 3, MN1A is part of a current mirror that includes NM1A, another PMOS transistor labeled "MN2A", and a resistor (R2A), where the current through the shared path 306 is amplified by N and is provided as an output signal (NGDRV, which is comparable to the control signal 206 in FIG. 2) for the shared voltage sensor circuit 116B.

As an example, in response to an overvoltage condition (the voltage level between PAD_A and PAD_B is above a threshold), Z1A-ZNA enter breakdown operations that enable some current to flow through the shared path 306 from PAD_A to PAD_B or vice versa. The current through the shared path 306 is amplified by the current mirror, and is provided as an output signal, NGDRV, from the shared voltage sensor circuit 116B to indicate an overvoltage condition. In response to the NGDRV signal indicating an overvoltage condition, the single power FET driver 118B outputs a drive signal (NG) to power FET logic 302 that includes power FETs 120B and 122B, where the power FETs 120B and 122B are examples of the power FETs 120A and 122A in FIG. 2, and are examples of the switches 120 and 122 in FIG. 1. In the example of FIG. 3, the single power FET driver 118B includes an NMOS transistor configured to receive the NGDRV signal at its control terminal.

In some examples, a resistor, RA, is between the control terminal of the power FET 120B and its second current terminal. Meanwhile, the first current terminal of the power FET 120B is coupled to the first device node 112B and PAD_A. As shown, a diode extends between the first and second current terminals of the power FET 120B. Likewise, in some examples, a resistor, RB, is between the control terminal of the power FET 122B and its second current terminal. Meanwhile, the first current terminal of the power FET 122B is coupled to the second device node 114B and PAD_B. As shown, a diode extends between the first and second current terminals of the power FET 122B.

In the example of FIG. 3, the drive signal, NG, passes through a diode, DA, having its cathode facing a control terminal of the power FET 120B (NG becomes "NGA" for the power FET 120B). The drive signal, NG, also passes through a diode, DB, having its cathode facing a control terminal of the power FET 122B (NG becomes "NGB" for the power FET 122B). In response to the drive signal, NG, the power FETs 120B and 122B allow current flow between PAD_A and PAD_B or vice versa, resulting in a clamped voltage signal (e.g., the clamped voltage signal 140B) between PAD_A and PAD_B.

Figure 4:
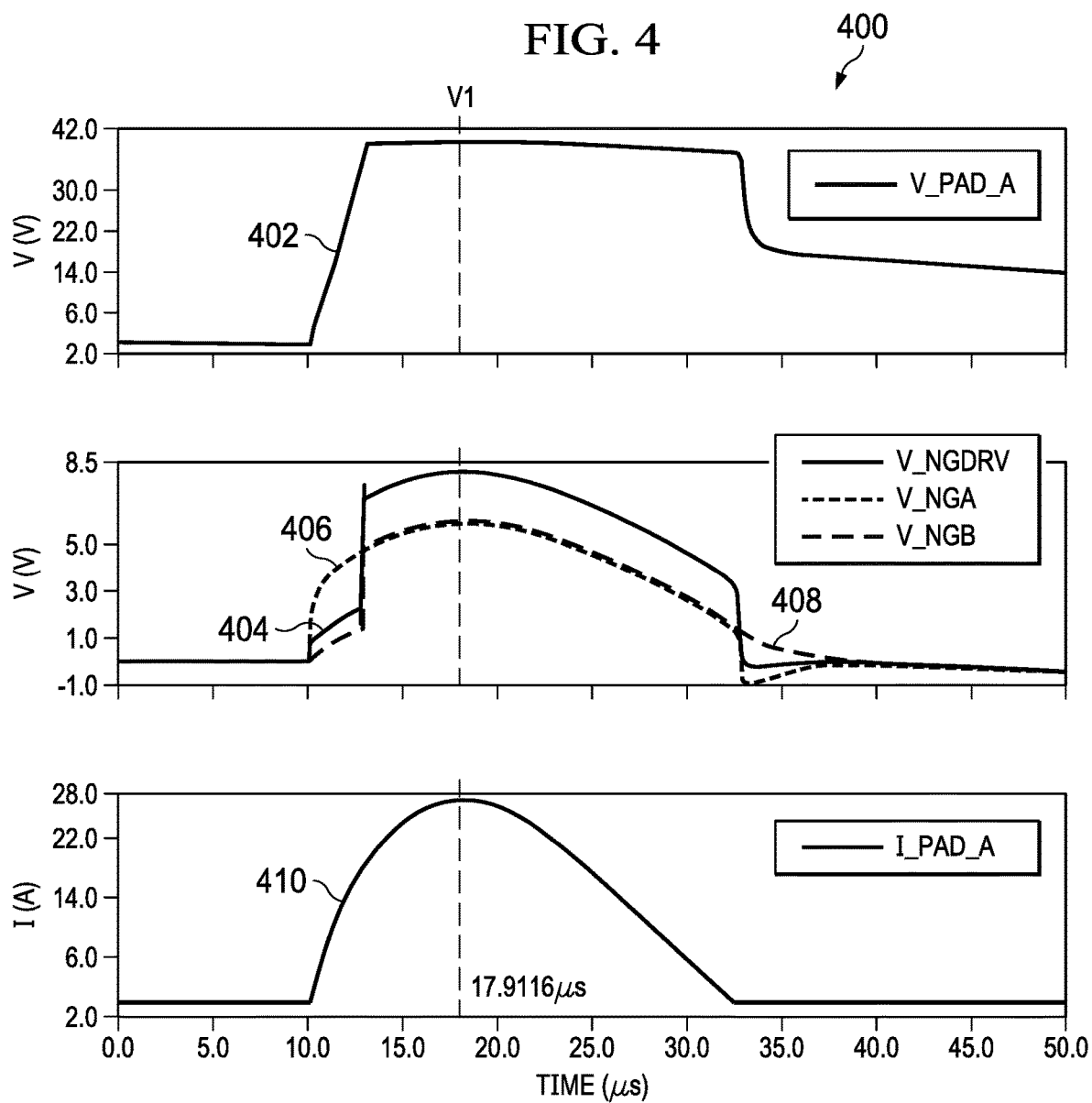
FIG. 4 is a timing diagram showing example signals related to the bidirectional flat clamp device of FIG. 3.

FIG. 4 is a timing diagram 400 showing example signals related to the bidirectional flat clamp device 300 of FIG. 3. In the timing diagram 400, the V_PAD_A signal 402 represents voltage as a function of time at PAD_A, the V_NGDRV signal 404 represents voltage as a function of time for a control signal from a shared voltage sensor circuit (e.g., the shared voltage sensor circuit 116B in FIG. 3), the V_NGA signal 406 represents voltage as a function of time for a drive signal to the power FET 120B, the V_NGB signal 408 represents voltage as a function of time for a drive signal to the power FET 122B, and the I_PAD_A signal 410 represents current as a function of time at PAD_A.

Figure 5:
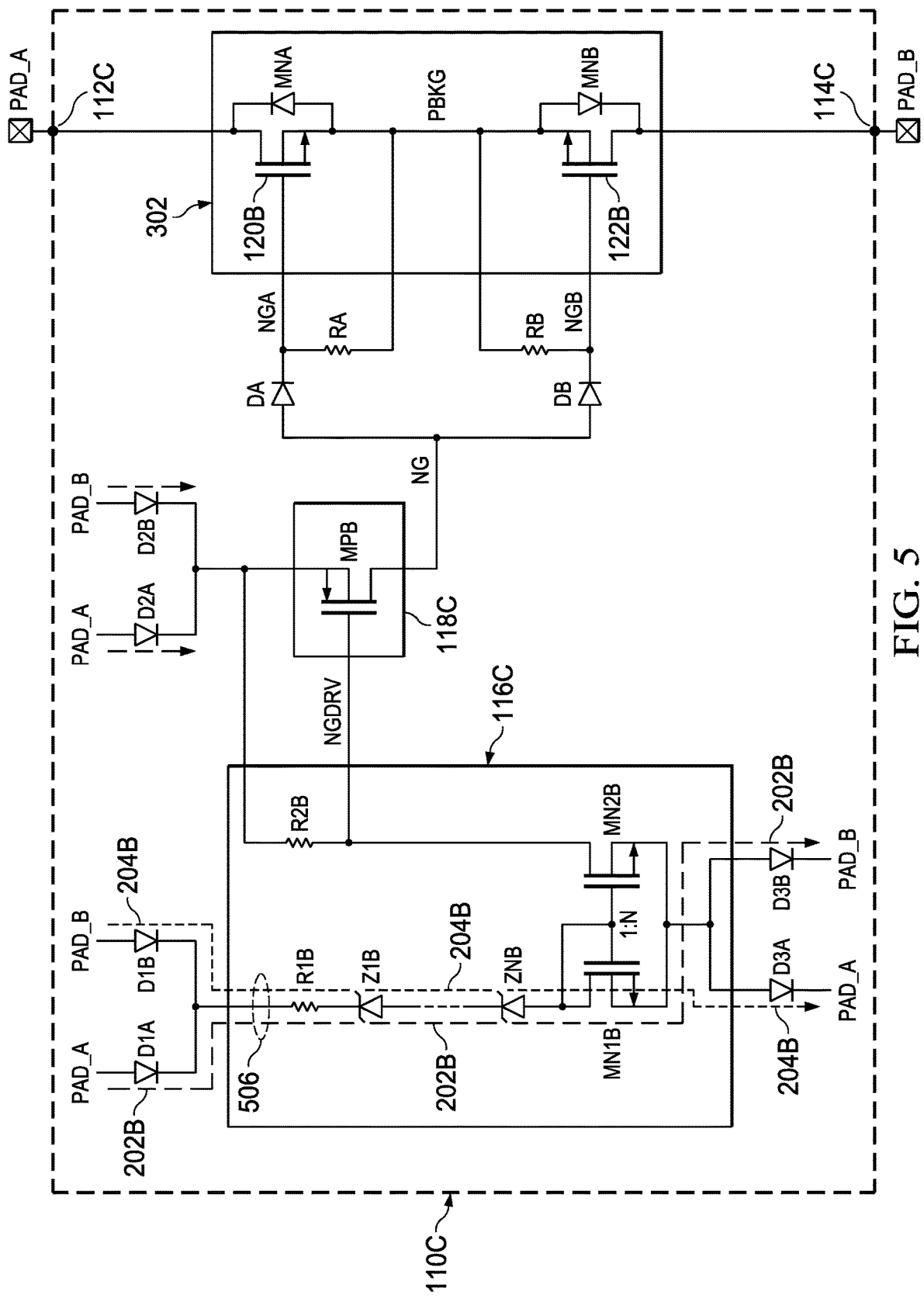
FIG. 5 is a schematic diagram showing another bidirectional flat clamp device in accordance with various examples.

FIG. 5 is a schematic diagram showing another bidirectional flat clamp device 110C in accordance with various examples. In FIG. 5, the bidirectional flat clamp device 110C is an example of the bidirectional flat clamp 110A of FIG. 2, or the bidirectional flat clamp 110 of FIG. 1. In some examples, the bidirectional flat clamp device 110C corresponds to an integrated circuit or chip. As shown, the bidirectional flat clamp device 110C includes a shared voltage sensor circuit 116C, which is an example of the shared voltage sensor circuit 116A of FIG. 2, or the shared voltage sensor circuit 116 of FIG. 1. Also, the bidirectional flat clamp device 110C includes first and second device nodes 112C and 114C, which are examples of the first and second device nodes 112A and 114A in FIG. 2, or the first and second device nodes 112 and 114 in FIG. 1. In FIG. 5, the device node 112C couples to PAD_A, which represents node 102 of FIG. 1 or another connection point. Meanwhile, the device node 114C couples to "PAD_B", which represents node 104 of FIG. 1 or another connection point. In FIG. 5, the bidirectional flat clamp device 110C is represented as having the first device node 112C coupled to PAD_A and the second device node 114C coupled to PAD_B. As another option, the first device node 112C could be coupled to PAD_B while the second device node 114C is coupled to PAD_A.

To control the direction of current flow through the shared voltage sensor circuit 116C and to prevent current flow directly between PAD_A and PAD_B, the bidirectional flat clamp device 110C includes diodes D1A, D1B, D3A and D3B. More specifically, D1A is positioned along a first current path 202B that extends from PAD_A (or the first device node 112C) to the shared voltage sensor circuit 116C, where D1A's cathode faces the shared voltage sensor circuit 116C. Also, D1B is positioned along a second current path 204A that extends from PAD_B (or the second device node 114C) to the shared voltage sensor circuit 116C, where D1B's cathode faces the shared voltage sensor circuit 116C. Meanwhile, D3B is positioned along the first current path 202B between PAD_B (or the second device node 114C) and the shared voltage sensor circuit 116C, where D3B's cathode faces PAD_B. Also, D3A is positioned along the second current path 204A between PAD_A (or the first device node 112C) and the shared voltage sensor circuit 116C, where D3A's cathode faces PAD_A.

In FIG. 5, the bidirectional flat clamp device 110C also includes a single power FET driver 118C, which is an example of the single power FET driver 118A in FIG. 2, or the switch driver 118 in FIG. 1. To control the direction of current flow to the single power FET driver 118C and to prevent current flow directly between PAD_A and PAD_B (or between the first and second device nodes 112C and 114C), the bidirectional flat clamp device 110C includes diodes D2A and D2B. More specifically, D2A is between PAD_A (or the first device node 112C) and the single power FET driver 118C, where D2A's cathode faces the single power FET driver 118C. Meanwhile, D2B is between PAD_B (or the second device node 114C) and the single power FET driver 118C, where D2B's cathode faces the single power FET driver 118C.

In FIG. 5, the first and second current paths 202B and 204B include a shared path 506 through the shared voltage sensor circuit 116C. More specifically, the shared path 506 comprises a plurality of components in series. In some examples, the plurality of components in series along the shared path 506 include Zener diodes Z1B-ZNB (where the number of Zener diodes used depends on a target breakdown voltage for the bidirectional flat clamp device 110C), a resistor (R1B), and an NMOS transistor labeled "MN1B". In the example of FIG. 5, MN1B is part of a current mirror that includes MN1B, another NMOS transistor labeled "MN2B", and a resistor (R2B), where the current through the plurality of components in series along the shared path 506 is amplified by N and is provided as an output signal for the shared voltage sensor circuit 116C.

As an example, in response to an overvoltage condition (the voltage level between PAD_A and PAD_B is above a threshold), Z1B-ZNB enter breakdown operations that enable some current to flow through the shared path 506 from PAD_A to PAD_B or vice versa. The current through the shared path 506 is amplified by the current mirror, and is provided as an output signal (NGDRV) from the shared voltage sensor circuit 116C to indicate an overvoltage condition. In response to the NGDRV signal indicating an overvoltage condition, the single power FET driver 118C outputs a drive signal (NG) to power FET logic 302 that includes power FETs 120B and 122B, where the power FETs 120B and 122B are examples of the power FETs 120A and 122A in FIG. 2, and are examples of the switches 120 and 122 in FIG. 1. In the example of FIG. 5, the single power FET driver 118C includes a PMOS transistor labeled "MPB" configured to receive the NGDRV signal at its control terminal.

In some examples, a resistor, RA, is between the control terminal of the power FET 120B and its second current terminal. Meanwhile, the first current terminal of the power FET 120B is coupled to the first device node 112C and PAD_A. As shown, a diode extends between the first and second current terminals of the power FET 120B. Likewise, in some examples, a resistor, RB, is between the control terminal of the power FET 122B and its second current terminal. Meanwhile, the first current terminal of the power FET 122B is coupled to the second device node 114C and PAD_B. As shown, a diode extends between the first and second current terminals of the power FET 122B.

In the example of FIG. 5, the drive signal, NG, passes through a diode, DA, having its cathode facing a control terminal of the power FET 120B (NG becomes "NGA" for the power FET 120B). The drive signal, NG, also passes through a diode, DB, having its cathode facing a control terminal of the power FET 122B (NG becomes "NGB" for the power FET 122B). In response to the drive signal, NG, the power FETs 120B and 122B allow current flow between PAD_A and PAD_B or vice versa, resulting in a clamped voltage signal (e.g., the clamped voltage signal 140B) between PAD_A and PAD_B.

Figure 6A:
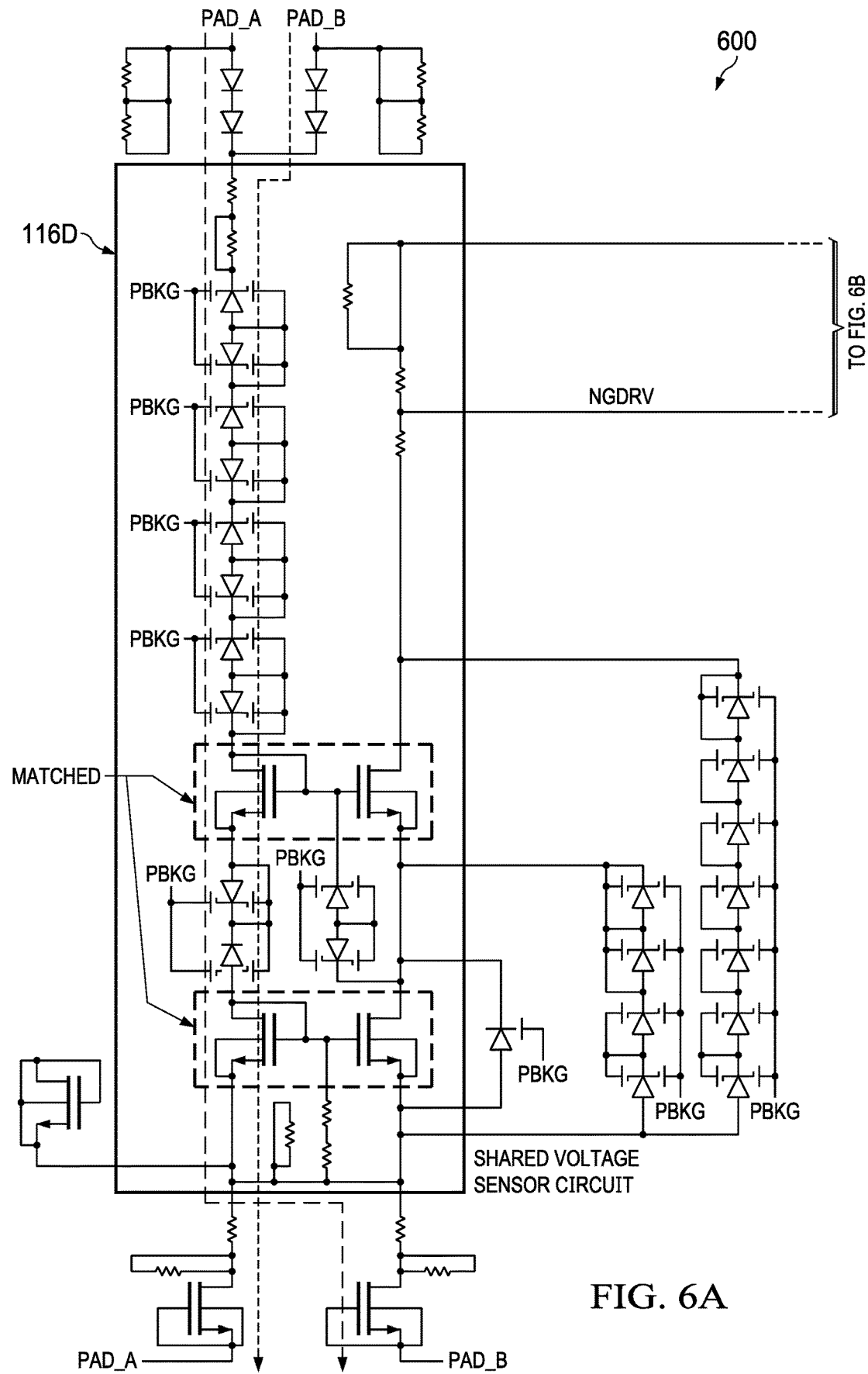
FIGS. 6A-6B are a schematic diagram showing another bidirectional flat clamp device in accordance with various examples.
Figure 6B:
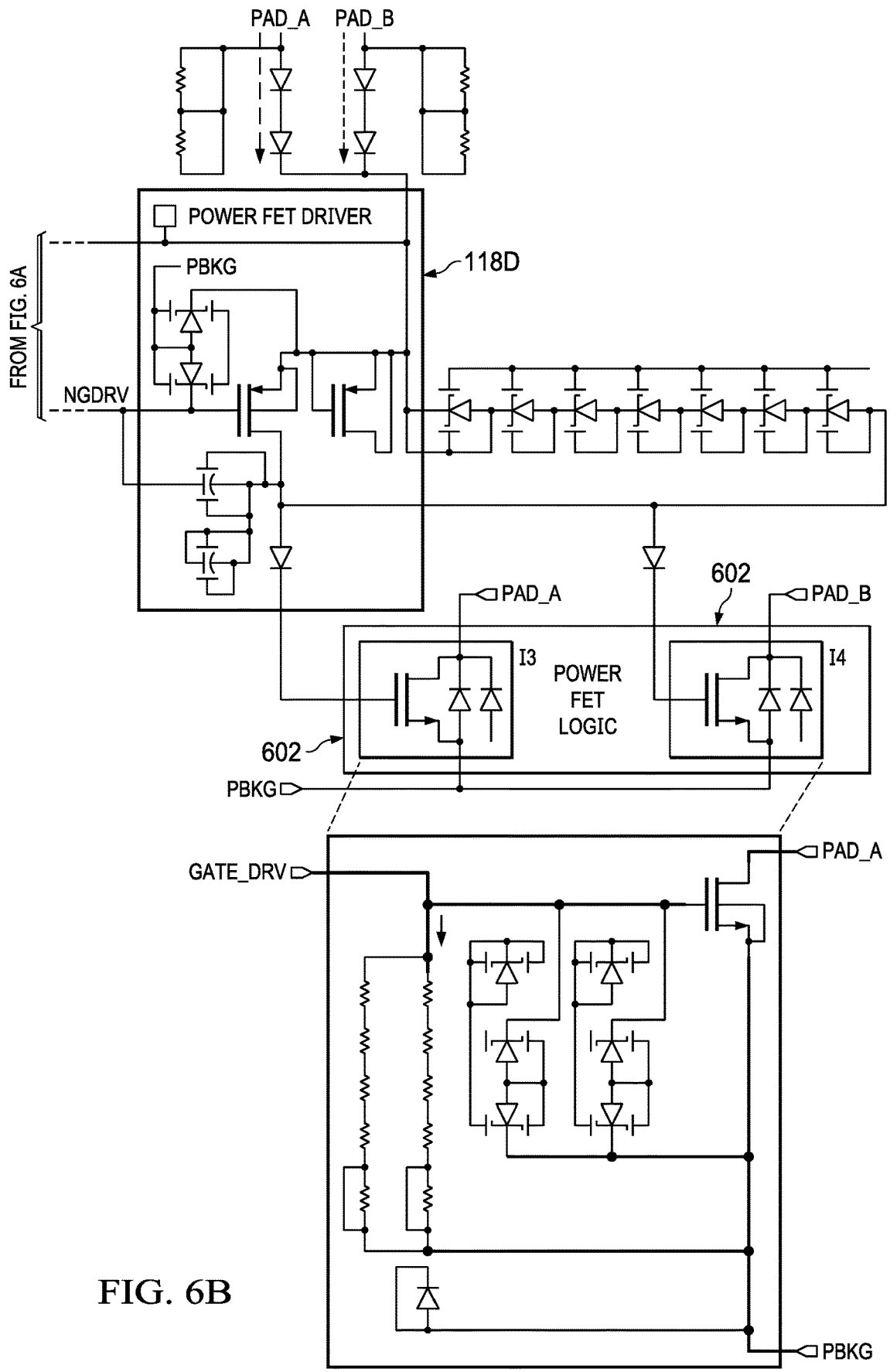

FIGS. 6A-6B are a schematic diagram showing another bidirectional flat clamp device 600 in accordance with various examples. As shown, the bidirectional flat clamp device 600 includes a shared voltage sensor circuit 116D, a single power FET driver 118D, and power FET logic 602. In operation, the shared voltage sensor circuit 116D provides the function described for the shared voltage sensor circuits previously described (e.g., the shared voltage sensor circuit 116C of FIG. 5, the shared voltage sensor circuit 116B of FIG. 3, the shared voltage sensor circuit 116A of FIG. 2, or the shared voltage sensor circuit 116 of FIG. 1). Similarly, the single power FET driver 118D provides the function described for the switch driver(s) or power FET driver(s) previously described (e.g., the single power FET driver 118C of FIG. 5, the single power FET driver 118B of FIG. 3, the single power FET driver 118A of FIG. 2, or the switch driver(s) 118 of FIG. 1). Also, the power FET logic 602 provides the function described for the switches or power FETs previously described (e.g., the power FETs 120B and 122B in FIGS. 3 and 5, the power FETs 120A and 122A in FIG. 2, or the switches 120 and 122 in FIG. 1).

Figure 7:
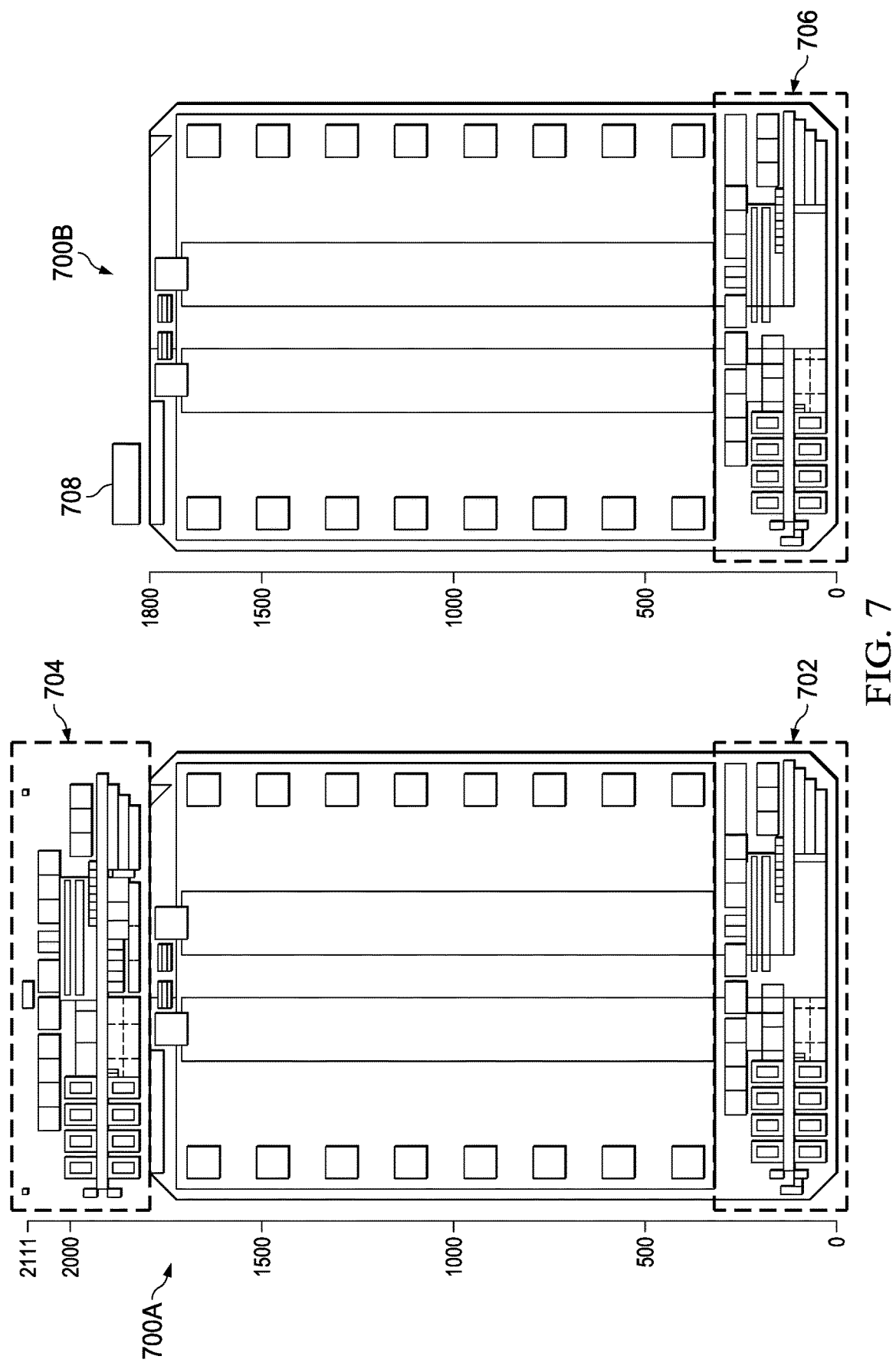
FIG. 7 are top views showing integrated circuit layouts comparing different bidirectional flat clamp topologies in accordance with various examples.

FIG. 7 are top views showing integrated circuit (IC) footprints 700A and 700B comparing bidirectional flat clamp topologies in accordance with various examples. For the IC footprint 700A, first and second voltage sensor circuits 702 and 704 are used. In contrast, for the IC footprint 700B, a shared voltage sensor circuit 706 is used. As represented in FIG. 7, use of shared voltage sensor circuit 706 reduces the IC footprint 700B relative to the IC footprint 700A by 15-20%. In at least some examples, the IC footprint 700B includes a space 708 for additional diodes (e.g., D1A, D1B, D2A, D2B, D3A, D3B) used to direct current flow as described herein, where the space 708 is small (e.g., 1-2% of the total footprint) compared to the space for a voltage sensor circuit (e.g., 15-20% of the total footprint). Also, in some examples, the IC footprint 700B is reduced relative to the IC footprint 700A by using a single switch driver or power FET driver in the IC footprint 700B instead of two switch drivers or power FET drivers.

Figure 8:
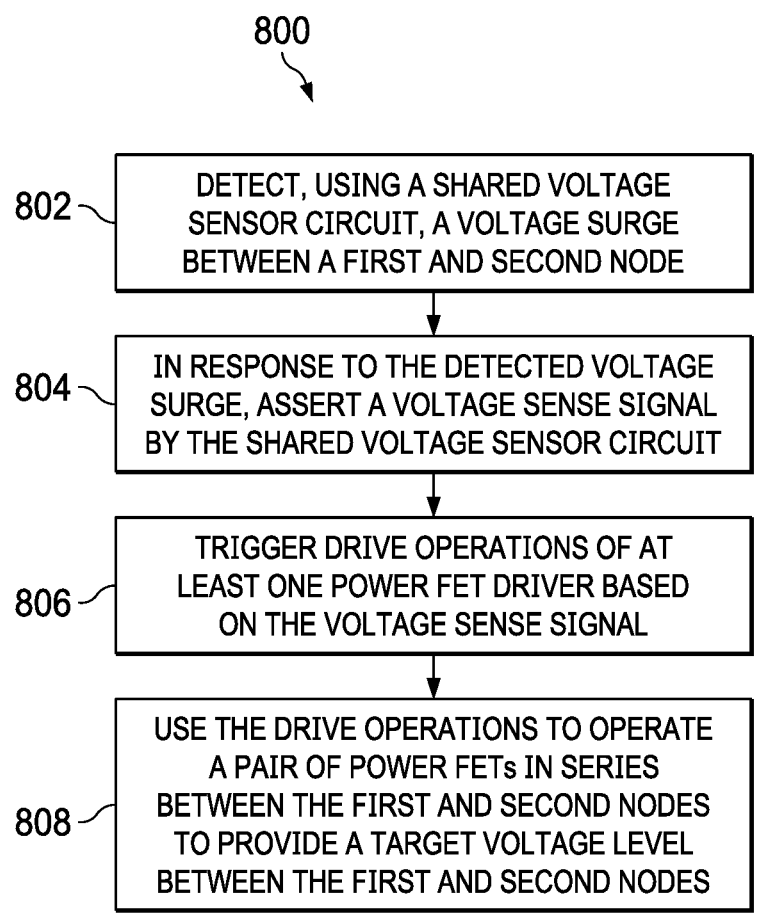
FIG. 8 is a flowchart showing a bidirectional flat clamp method in accordance with various examples.

FIG. 8 is a flowchart showing a bidirectional flat clamp method 800 in accordance with various examples. As shown, the method 800 includes using a shared voltage sensor circuit (e.g., the shared voltage sensor circuit 116 in FIG. 1, the shared voltage sensor circuit 116A in FIG. 2, the shared voltage sensor circuit 116B in FIG. 3, the shared voltage sensor circuit 116C in FIG. 5, or the shared voltage sensor circuit 116D in FIG. 6A) to detect a voltage surge or overvoltage condition between a first node (e.g., first device node 112 in FIG. 1, first device node 112A in FIG. 2, first device node 112B in FIG. 3, or first device node 112C in FIG. 5) and a second node (e.g., second device node 114 in FIG. 1, second device node 114A in FIG. 2, second device node 114b in FIG. 3, or second device node 114C in FIG. 5) at block 802. In response to the detected voltage surge or overvoltage condition, a voltage sense signal (e.g., control signal 208 in FIG. 2, or NGDRV in FIGS. 3 and 5) is asserted by the shared voltage sensor circuit at block 804. At block 806, drive operations of at least one power FET driver are triggered based on the voltage sense signal. In some examples, a single power FET driver is used. In other examples, multiple power FET drivers are used. At block 808, the drive operations are used to operate a pair of power FETs in series between the first and second nodes to provide a target voltage level between the first and second nodes.

In some examples, the method 800 also includes passively controlling a direction of current flow along a first current path (e.g., the first current path 202 in FIG. 2, the first current path 202A in FIG. 3, the first current path 202B in FIG. 5) that extends from the first node to the shared voltage sensor circuit to the second node, and passively controlling a direction of current flow along a second current path (e.g., the second current path 204 in FIG. 2, the second current path 204A in FIG. 3, the second current path 204B in FIG. 5) that extends from the second node to the shared voltage sensor circuit to the first node. In some examples, the at least one power FET driver is a single power FET driver, and the method 800 also includes controlling a direction of current flow from the first node to the single power FET driver, and controlling a direction of current flow from the second node to the single power FET driver. As described herein, in some examples, diodes are added to control a direction of current flow between nodes and from nodes to the shared voltage sensor circuit.

Certain terms have been used throughout this description and claims to refer to particular system components. This document does not intend to distinguish between components that differ only in name but not in their respective functions or structures. In this disclosure and claims, the terms "including" and "comprising" are used in an open-ended fashion, and thus should be interpreted to mean "including, but not limited to . . . " The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit comprising:
   a first switch having a first current terminal, a second current terminal, and a first control terminal;
   a second switch having a third current terminal, a fourth current terminal, and a second control terminal, the third current terminal coupled to the second current terminal;
   at least one switch driver coupled to the first control terminal and to the second control terminal;
   a first diode having a first anode and a first cathode, the first anode coupled to the first current terminal;
   a second diode having a second anode and a second cathode, the second anode coupled to the fourth current terminal and the second cathode coupled to the first cathode;
   a third diode having a third anode and a third cathode, the third cathode coupled to the first current terminal;
   a fourth diode having a fourth anode and a fourth cathode, the fourth cathode coupled to the fourth current terminal and the fourth anode coupled to the third anode; and
   a voltage sensor circuit coupled between the first cathode and the third anode, the voltage sensor circuit coupled to the at least one switch driver.

2. The circuit of claim 1, wherein the first switch is a first power field effect transistor (FET) and the second switch is a second power FET.

3. The circuit of claim 1, wherein the at least one switch driver is a single switch driver.

4. The circuit of claim 3, further comprising:
   a fifth diode having a fifth anode and a fifth cathode, the fifth anode coupled to the first current terminal and the fifth cathode coupled to the single switch driver; and
   a sixth diode having a sixth anode and a sixth cathode, the sixth anode coupled to the fourth current terminal and the sixth cathode coupled to the single switch driver.

5. The circuit of claim 1, wherein the at least one switch driver comprises two switch drivers.

6. The circuit of claim 1, wherein the voltage sensor circuit comprises:
   a current mirror coupled to the first cathode and to the second cathode; and
   a Zener diode coupled to the third anode and to the fourth anode.

7. The circuit of claim 1, wherein the voltage sensor circuit comprises Zener diodes, a resistor, and a current mirror, the current mirror comprising n-type metal oxide semiconductor (NMOS) transistors.

8. The circuit of claim 1, wherein the voltage sensor circuit comprises Zener diodes, a resistor, and current mirror, the current mirror comprising p-type metal oxide semiconductor (PMOS) transistors.

9. The circuit of claim 1, wherein a switch driver of the at least one switch driver comprises a PMOS transistor having a third control terminal, a fifth current terminal, and a sixth current terminal, wherein the third control terminal is coupled to the voltage sensor circuit, the fifth current terminal is coupled to the first current terminal and to the fourth current terminal, and the sixth current terminal is coupled to the first control terminal.

10. The circuit of claim 1, wherein a switch driver of the at least one switch driver comprises a NMOS transistor having a third control terminal, a fifth current terminal, and a sixth current terminal, wherein the third control terminal is coupled to the voltage sensor circuit, wherein the fifth current terminal is coupled to the first current terminal and to the fourth current terminal, and the sixth current terminal is coupled to the first control terminal.

11. A circuit comprising:
    a first diode having a first anode and a first cathode;
    a second diode having a second anode and a second cathode, the second cathode coupled to the first cathode;
    a third diode having a third anode and a third cathode, the third cathode coupled to the first anode;
    a fourth diode having a fourth anode and a fourth cathode, the fourth anode coupled to the third anode and the fourth cathode coupled to the second anode;
    a voltage sensor circuit coupled between the first cathode and the third anode;
    a switch driver coupled to the voltage sensor circuit;
    a fifth diode having a fifth anode and a fifth cathode, the fifth cathode coupled to the switch driver and the fifth anode coupled to the first anode; and
    a sixth diode having a sixth anode and a sixth cathode, the sixth cathode coupled to the fifth cathode and the sixth anode coupled to the second anode.

12. The circuit of claim 11, wherein the voltage sensor circuit comprising:
    a current mirror coupled to the first cathode and to the second cathode; and
    a Zener diode coupled to the third anode.

13. The circuit of claim 11, wherein the switch driver comprises a transistor having a first current terminal, a second current terminal, and a control terminal, the control terminal coupled to the voltage sensor circuit.

14. The circuit of claim 11, further comprising:
    a first transistor comprising a first current terminal, a second current terminal, and a first control terminal, the first current terminal coupled to the first anode; and
    a second transistor having a third current terminal, a fourth current terminal, and a second control terminal, wherein the third current terminal is coupled to the second current terminal and the fourth current terminal is coupled to the second anode.

15. The circuit of claim 14, further comprising:
    a first resistor having a first resistor terminal and a second resistor terminal, the first resistor terminal coupled to the first control terminal and the second resistor terminal coupled to the second current terminal; and
    a second resistor having a third resistor terminal and a fourth resistor terminal, the third resistor terminal coupled to the second control terminal and the fourth resistor terminal coupled to the third.

16. The circuit of claim 14, further comprising:
    a seventh diode having a seventh anode and a seventh cathode, the seventh cathode coupled to the first control terminal; and
    an eighth diode having an eighth anode and an eighth cathode, the eighth cathode coupled to the second control terminal and the eighth anode coupled to the seventh anode.

17. The circuit of claim 16, further comprising:
    a third transistor having a fifth current terminal, a sixth current terminal, and a third control terminal, the sixth current terminal coupled to the fifth anode and the third control terminal coupled to the voltage sensor circuit;
    a ninth diode having a ninth anode and a ninth cathode, the ninth cathode coupled to the fifth current terminal and the ninth anode coupled to the first anode; and
    a tenth diode having a tenth anode and a tenth cathode, the tenth cathode coupled to the ninth cathode and the tenth anode coupled to the second anode.

18. A circuit comprising:
a first transistor having a first current terminal, a second current terminal, and a first control terminal, the first control terminal coupled to the second current terminal;
a second transistor having a third current terminal, a fourth current terminal, and a second control terminal, the third current terminal coupled to the first current terminal and the second control terminal coupled to the first control terminal;
a resistor having a first resistor terminal and a second resistor terminal, the first resistor terminal coupled to the fourth current terminal;
a sequence of Zener diodes coupled in series, the sequence of Zener diodes having a cathode terminal and an anode terminal, the anode terminal coupled to the second resistor terminal and the cathode terminal coupled to the second current terminal;
a third transistor having a fifth current terminal, a sixth current terminal, and a third control terminal, the third control terminal coupled to the fourth current terminal;
a fourth transistor having a seventh current terminal, an eighth current terminal, and a fourth control terminal, the fourth control terminal coupled to the sixth current terminal; and
a fifth transistor having a ninth current terminal, a tenth current terminal, and a fifth control terminal, the fifth control terminal coupled to the fourth control terminal and the ninth current terminal coupled to the eighth current terminal.

19. The circuit of claim 18, wherein the resistor is a first resistor, the circuit further comprising a second resistor coupled in series with the sequence of Zener diodes.

20. The circuit of claim 18, further comprising:
a first diode having a first anode and a first cathode, the first cathode coupled to the first current terminal;
a second diode having a second anode and a second cathode, the second cathode coupled to the first cathode;
a third diode having a third anode and a third cathode, the third anode coupled to the anode terminal and the third cathode coupled to the first anode; and
a fourth diode having a fourth anode and a fourth cathode, the fourth anode coupled to the third anode and the fourth cathode coupled to the second anode.

\* \* \* \* \*